United States Patent
Choi et al.

(10) Patent No.: US 8,558,216 B2
(45) Date of Patent: Oct. 15, 2013

(54) NITRIDE SEMICONDUCTOR LIGHT EMITTING DEVICE AND METHOD FOR MANUFACTURING THE SAME

(75) Inventors: Byeong-Kyun Choi, Osan-si (KR); Jae-Heun Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 118 days.

(21) Appl. No.: 12/971,721

(22) Filed: Dec. 17, 2010

(65) Prior Publication Data

US 2011/0220868 A1    Sep. 15, 2011

(30) Foreign Application Priority Data

Mar. 9, 2010  (KR) .................. 10-2010-0020660

(51) Int. Cl.
*H01L 29/06*   (2006.01)
(52) U.S. Cl.
USPC .............. 257/13; 257/E33.006; 257/E33.012; 438/33
(58) Field of Classification Search
USPC ................ 257/13, E33.006, E33.012; 438/33
See application file for complete search history.

(56) References Cited

U.S. PATENT DOCUMENTS

2003/0122480 A1*   7/2003   Wei et al. ................ 313/506
2009/0045434 A1*   2/2009   Muraki et al. ........... 257/103

FOREIGN PATENT DOCUMENTS

CN    101331617 A    12/2008

* cited by examiner

*Primary Examiner* — Marvin Payen
(74) *Attorney, Agent, or Firm* — Birch, Stewart, Kolasch & Birch, LLP

(57) ABSTRACT

Discussed are a nitride semiconductor light emitting device in which a critical angle is increased by rounding corners of a substrate so as to improve light extraction efficiency due to increase in an amount of light generated from the inside thereof and extracted to the outside, and a method for manufacturing the same. The nitride semiconductor light emitting device includes according to an embodiment a buffer layer formed on a substrate, a light emitting structure including a first conductive semiconductor layer, an active layer and a second conductive semiconductor layer, formed on the buffer layer, a first electrode formed on the first conductive semiconductor layer, and a second electrode formed on the second conductive semiconductor layer, wherein the substrate has a light transmitting property, and respective corners of the substrate are rounded so as to have a designated curvature.

3 Claims, 18 Drawing Sheets

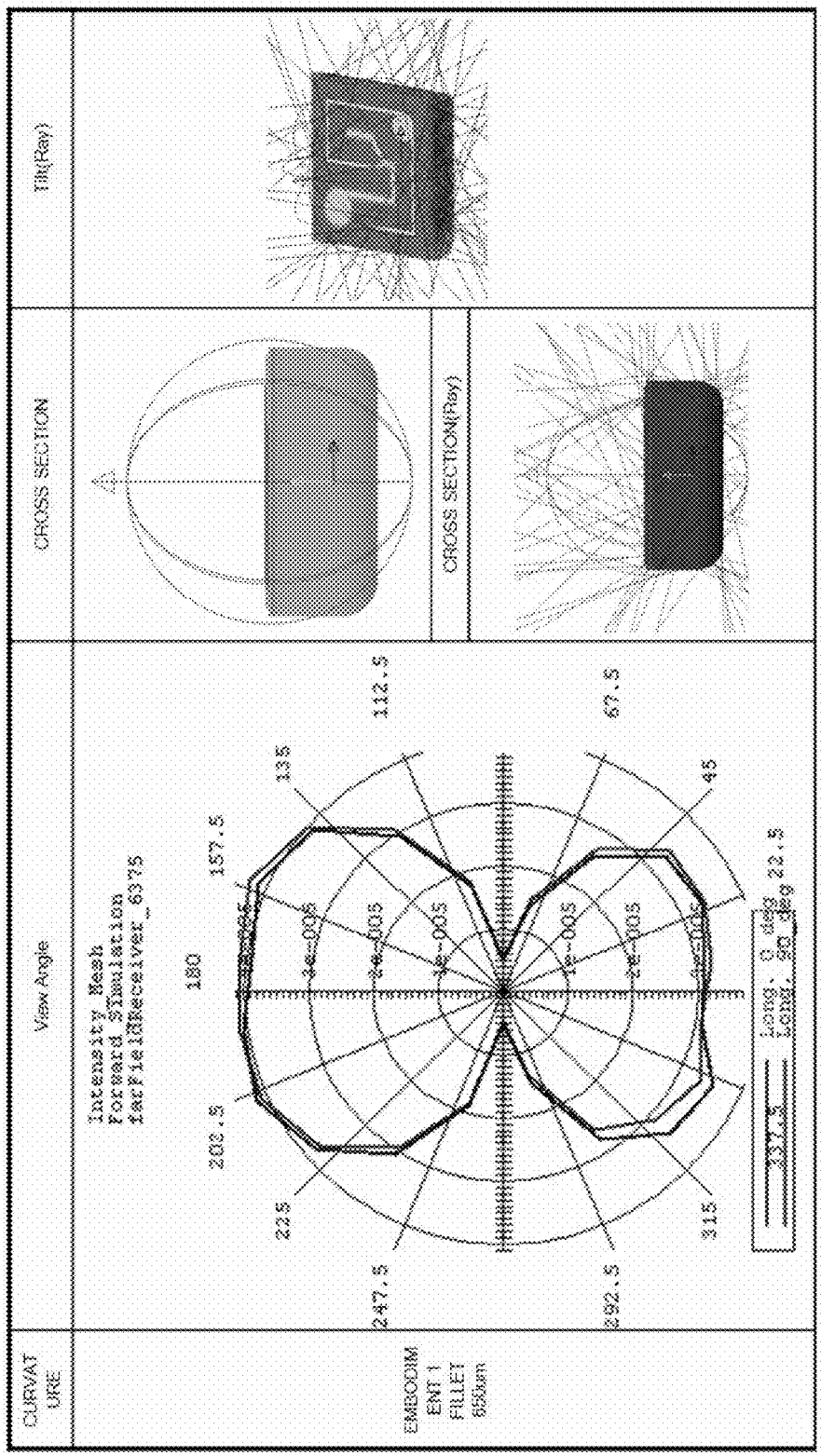

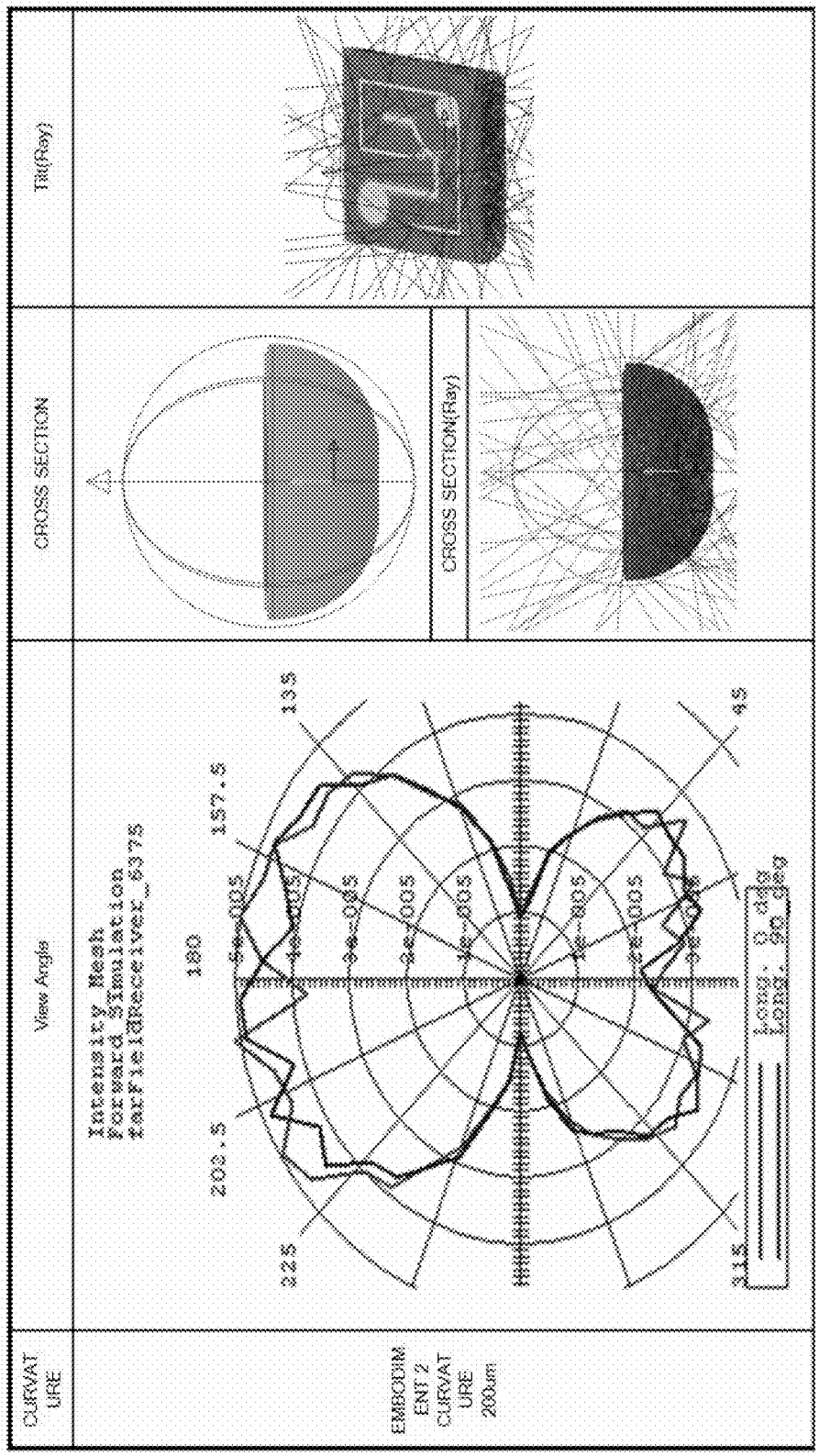

NITRIDE SEMICONDUCTOR LIGHT EMITTING DEVICE AND METHOD FOR MANUFACTURING THE SAME

This application claims the priority benefit of Korean Patent Application No. 10-2010-0020660, filed on Mar. 9, 2010, which is hereby incorporated by reference as if fully set forth herein.

BACKGROUND OF THE INVENTION

1. Field of the Invention

The present invention relates to a nitride semiconductor light emitting device and a method for manufacturing the same, and more particularly, a nitride semiconductor light emitting device which improves light extraction efficiency and a method for manufacturing the same.

2. Discussion of the Related Art

In general, a nitride Light Emitting Diode (LED) has a light emitting region including ultraviolet ray, blue light, and green light. Particularly, a GaN-based nitride semiconductor LED is applied to optical devices of blue/green LEDs, and high-switching and high-output electronic devices, such as Metal Semiconductor Field Effect Transistors (MESFET) and Hetero junction Field-Effect Transistors (HEMT).

FIG. 1 is a longitudinal-sectional view illustrating a conventional nitride semiconductor light emitting device.

As shown in FIG. 1, the conventional nitride semiconductor light emitting device includes a buffer layer 12 on a substrate 11, an n-GaN layer 13 on the buffer layer 12, an active layer 14 formed in a multiple quantum well structure to emit light, a p-GaN layer 15, and a transparent electrode 16.

Here, after the n-GaN layer 13 is exposed to the outside by selectively etching the transparent electrode 16 to the n-GaN layer 13, an n-type electrode 18 is formed on the exposed n-GaN layer 13, and a p-type electrode 17 is formed on the transparent electrode 16.

The above conventional nitride semiconductor light emitting device has a principle that photons are generated by electron-hole recombination at the active layer 14 between a P/N junction and the photons escape to the outside of the light emitting device, thereby generating light.

FIG. 2A is a longitudinal-sectional view schematically illustrating a final shape of the substrate in the conventional nitride semiconductor light emitting device, and FIG. 2B is a view illustrating extraction of light generated from the inside of the substrate of FIG. 2A to the outside.

In order to increase light extraction efficiency of the conventional nitride semiconductor light emitting device, a nitride semiconductor growth technique or a method of changing the structure of the device using a chip process is used. Otherwise, the light extraction efficiency may be increased through surface treatment of a certain material.

First, if roughness of a p-GaN layer is achieved according to nitride semiconductor growth requirements, internal quantum efficiency is lowered due to diffusion of magnesium (Mg). However, external quantum efficiency may be improved. Further, in order to use roughness of the p-GaN layer, a technical drawback, such as elongation of a cycle of multiple quantum wells, may be encountered.

Further, the conventional p-GaN layer having a thickness of 150~200 nm cannot be uniformly patterned, and thus the thickness of the p-GaN layer needs to be artificially increased. However, if the p-GaN layer has an increased thickness through growth, resistance of p-GaN layer is increased, and current crowding occurs due to the fact that dispersion of current is carried out in the vertical direction rather than in the horizontal direction, thereby causing an increase in operating voltage.

Although the p-GaN layer having an increased thickness is obtained through growth, the p-GaN layer must have a high-quality surface. However, in order to prevent degradation of the active layer during growing of the p-GaN layer, the p-GaN layer is grown at a low temperature. If the thickness of the p-GaN layer grown at a low temperature is increased, then the p-GaN layer cannot have a high-quality surface and thus the performance of the device is lowered. A doping concentration of magnesium (Mg) used to form the p-GaN layer and growth conditions of the P-GaN layer are factors greatly influencing the shape of the surface of the p-GaN layer, and thus high precision is required when performing a growth process.

Second, regarding to changing the structure of a device using the chip process, a part of a sapphire substrate or LED GaN layer is formed to a reverse mesa structure so as to prevent generated light from being confined therein and lost, as a chip shaping technique. In order to form the part of the sapphire substrate or LED GaN layer to a reverse mesa structure, wet etching is mainly used and an etching solution of the wet etching is one out of strong acids, such as sulfuric acid, phosphoric acid, and nitric acid, a base, such as potassium hydroxide, or mixtures of at least two thereof. In order to perform wet etching of a nitride semiconductor compound, a high temperature is required. In terms of properties of wet etching, it is difficult to achieve precise control and concentration set, and use of a mixture of phosphoric acid and sulfuric acid, which is mainly used, is dangerous.

Finally, a method of increasing light extraction efficiency of a nitride semiconductor light emitting device by roughing a transparent conductive film, such as ITO, is used. The transparent conductive film is roughed by changing parameters of a deposition process, or wet etching is used. However, this method has a drawback, such as difficulty in verifying process reproducibility.

SUMMARY OF THE INVENTION

Accordingly, the present invention is directed to a nitride semiconductor light emitting device and a method for manufacturing the same.

One object of the present invention is to provide a nitride semiconductor light emitting device in which a critical angle is increased by rounding corners of a substrate so as to improve light extraction efficiency due to an increase in an amount of light generated from the inside of the substrate and extracted to the outside, and a method for manufacturing the same.

To achieve this object and other advantages and in accordance with the purpose of the invention, as embodied and broadly described herein, a nitride semiconductor light emitting device includes a buffer layer formed on a substrate, a light emitting structure including a first conductive semiconductor layer, an active layer and a second conductive semiconductor layer, formed on the buffer layer, a first electrode formed on the first conductive semiconductor layer, and a second electrode formed on the second conductive semiconductor layer, wherein the substrate has a light transmitting property, and respective corners of the substrate are rounded so as to have a designated curvature.

In another aspect of the present invention, a method for manufacturing a nitride semiconductor light emitting device includes forming a buffer layer on a substrate, forming a light emitting structure by sequentially stacking a first conductive semiconductor layer, an active layer and a second conductive semiconductor layer on the buffer layer, performing mesa etching of a selective region of the second conductive semiconductor layer until the first conductive semiconductor layer is exposed, forming a first electrode on the exposed first conductive semiconductor layer and a second electrode on the second conductive semiconductor layer, respectively, lapping and polishing the substrate provided with the first electrode and second electrode formed thereon; rounding respective corners of the substrate on which the lapping and the polishing have been completed, and dividing the substrate, the corners of which are rounded, into respective devices through scribing and breaking processes.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 9A-9E show illustrating light extraction efficiency according to shapes of the substrates in the conventional nitride semiconductor light emitting device and the nitride semiconductor light emitting devices in accordance with the embodiments of the present invention.

DETAILED DESCRIPTION OF THE INVENTION

Hereinafter, with reference to the accompanying drawings, a nitride semiconductor light emitting device and a method for manufacturing the same will be described in detail.

FIGS. 3A and 3B to FIGS. 5A and 5B are longitudinal-sectional views schematically illustrating final shapes of substrates in nitride semiconductor light emitting devices in accordance with various embodiments of the present invention, and views illustrating extraction of light generated from the insides of the substrates to the outside, respectively.

In the nitride semiconductor light emitting device in accordance with the present invention, as shown in FIGS. 3A and 3B to FIGS. 5A and 5B, corners of a substrate are rounded and thus a critical angle is increased, thereby increasing an amount of light generated from the inside thereof and extracted to the outside and thus improving light extraction efficiency.

Figure 1:
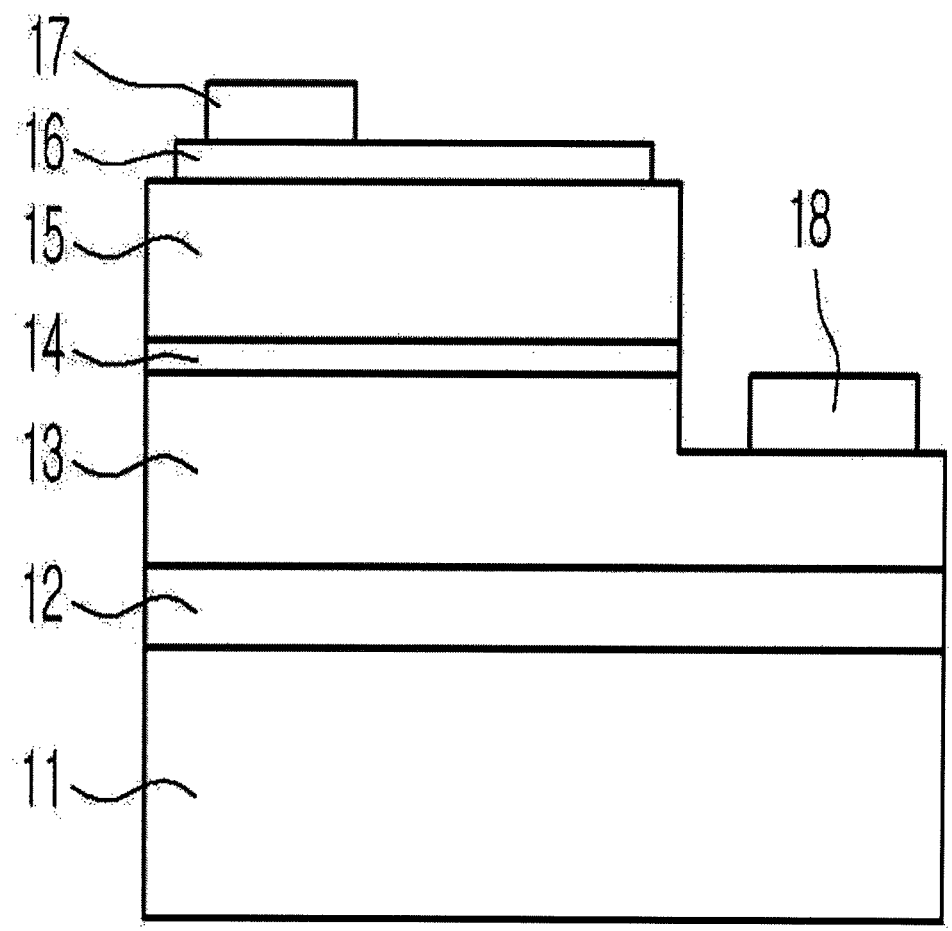
FIG. 1 is a longitudinal-sectional view illustrating a conventional nitride semiconductor light emitting device.
Figure 2A:
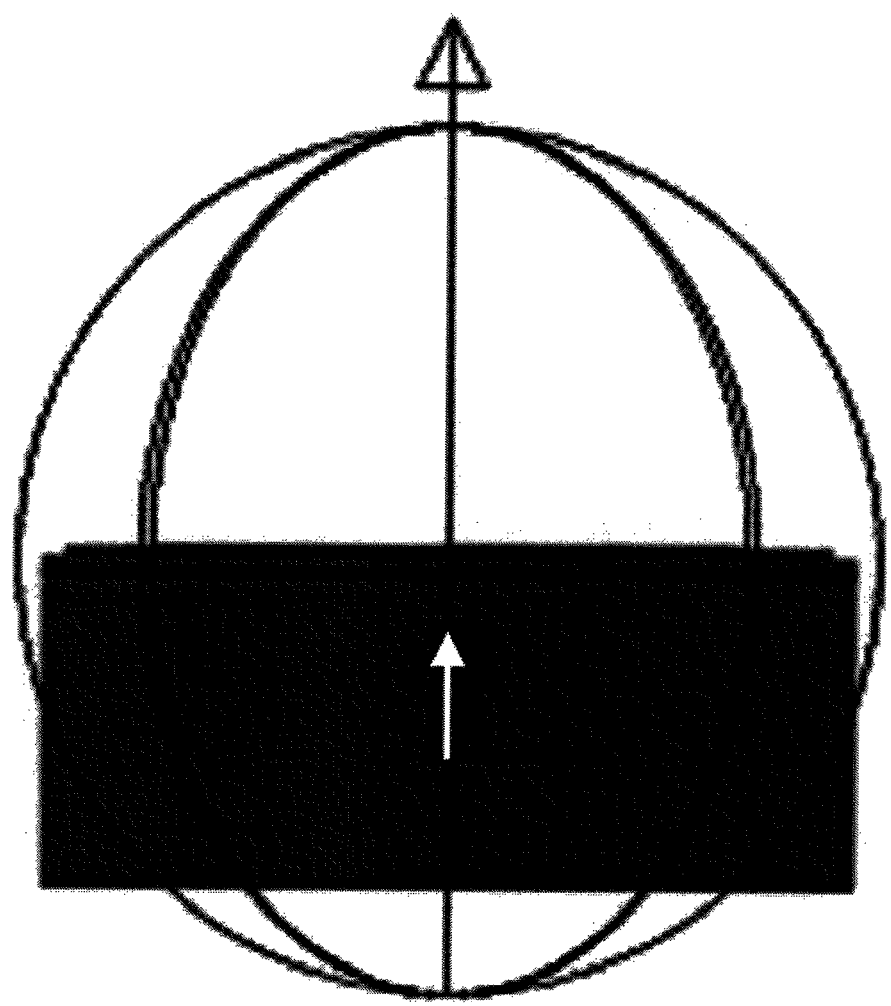
FIG. 2A is a longitudinal-sectional view schematically illustrating a final shape of a substrate in the conventional nitride semiconductor light emitting device.
Figure 2B:
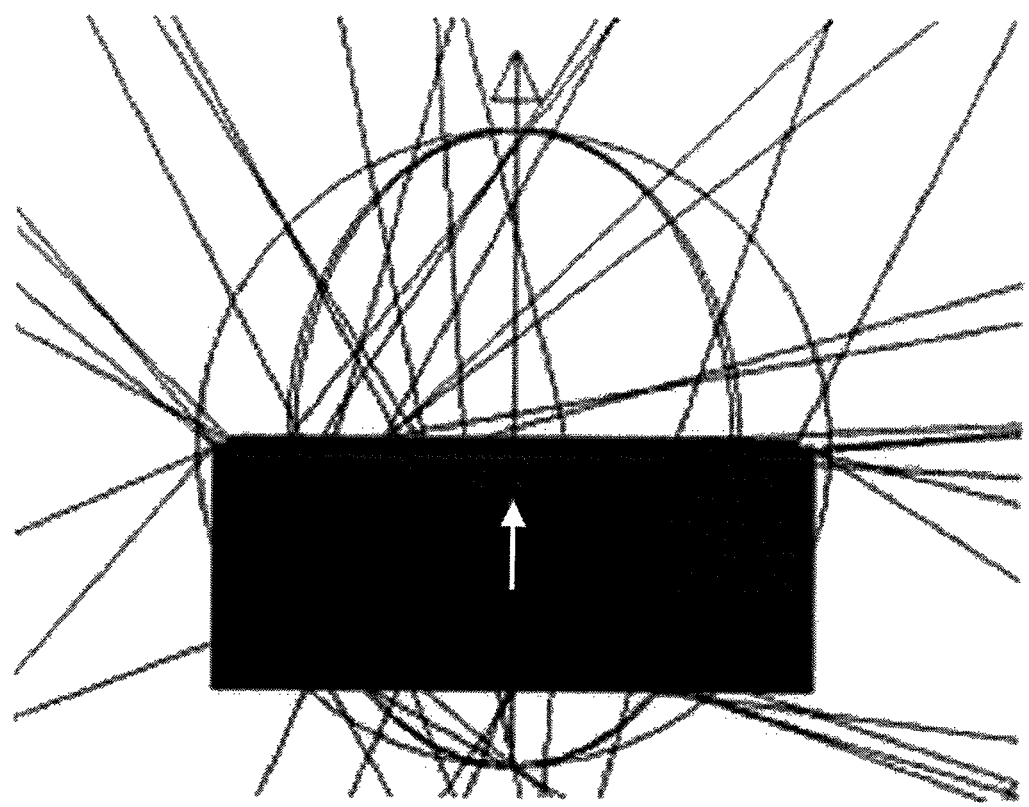
FIG. 2B is a view illustrating extraction of light generated from the inside of the substrate of FIG. 2A to the outside.
Figure 3A:
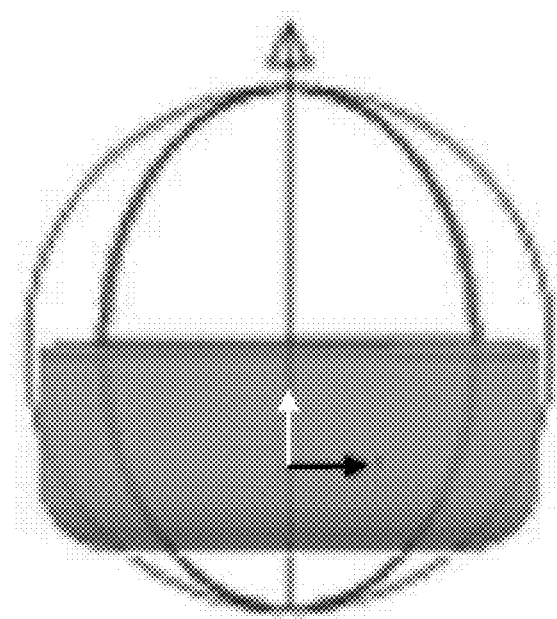
FIGS. 3A and 3B, 4A and 4B, and 5A and 5B are longitudinal-sectional views schematically illustrating final shapes of substrates in nitride semiconductor light emitting devices in accordance with various embodiments of the present invention, and views illustrating extraction of light generated from the insides of the substrates to the outside, respectively.
Figure 3B:
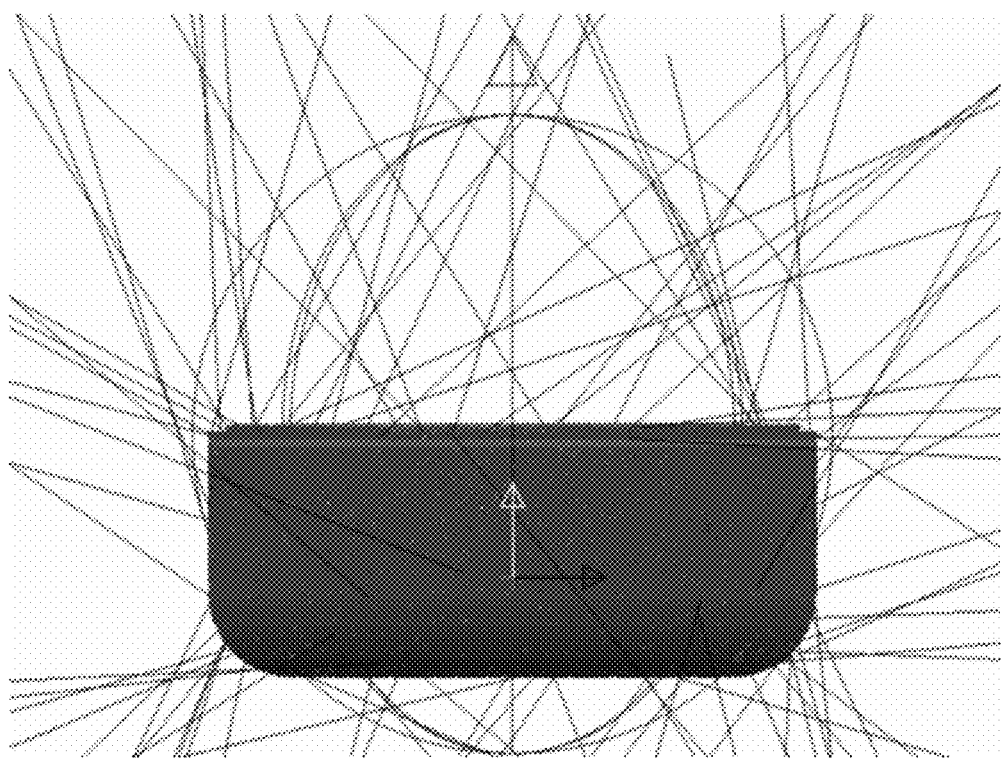
Figure 4A:
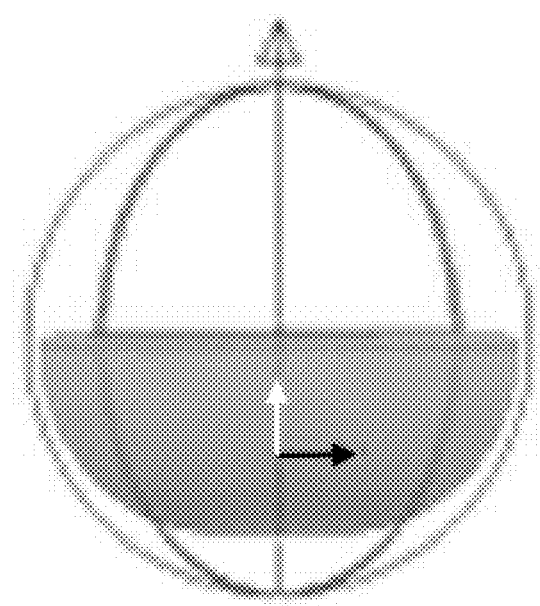
Figure 4B:
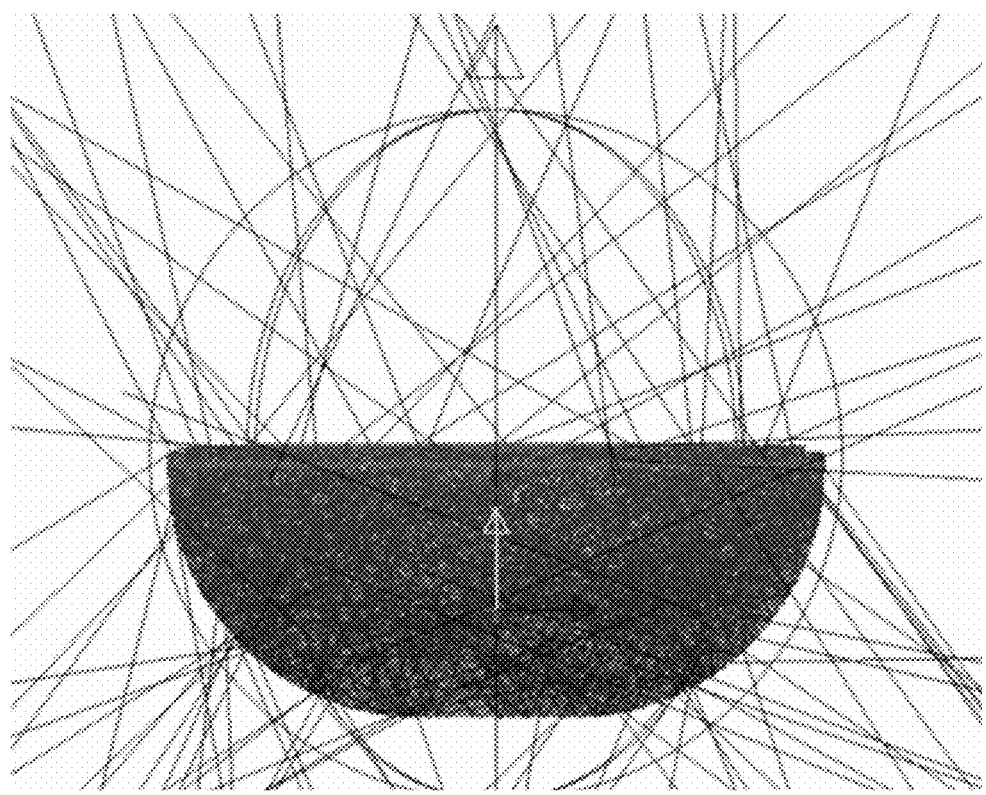
Figure 5A:
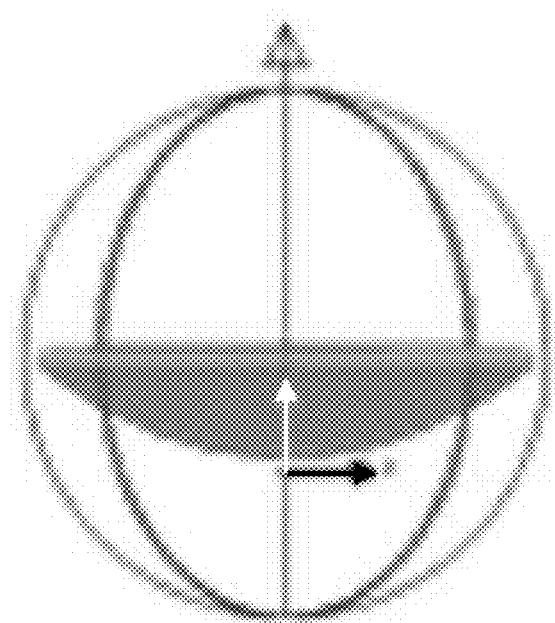
Figure 5B:
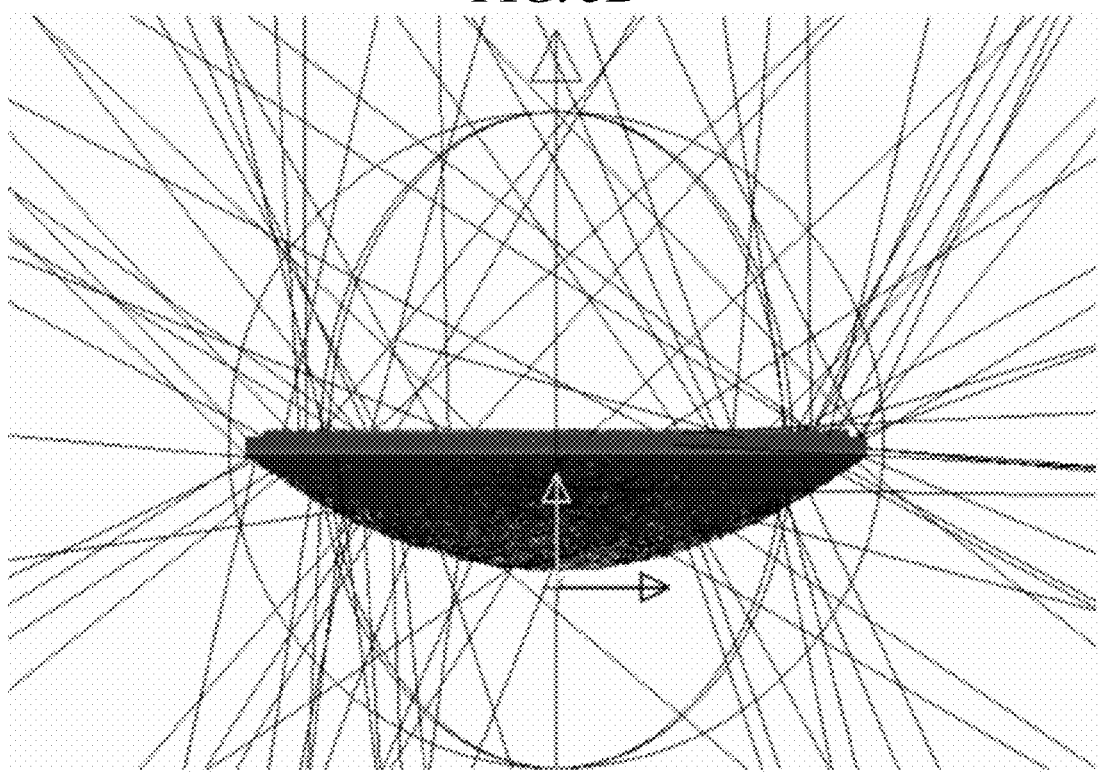
Figure 6:
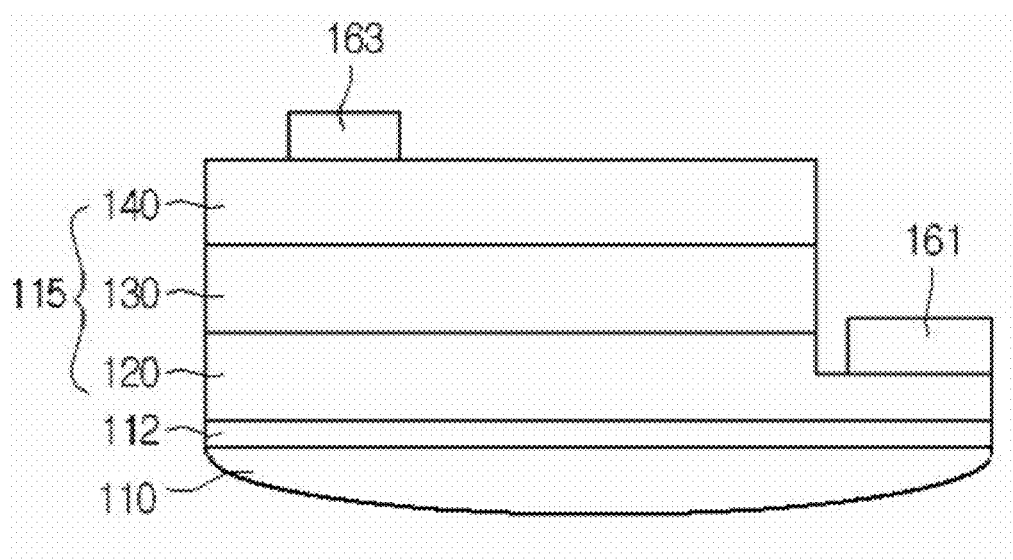
FIG. 6 is a longitudinal-sectional view illustrating the nitride semiconductor light emitting device in accordance with the present invention.
Figure 7:
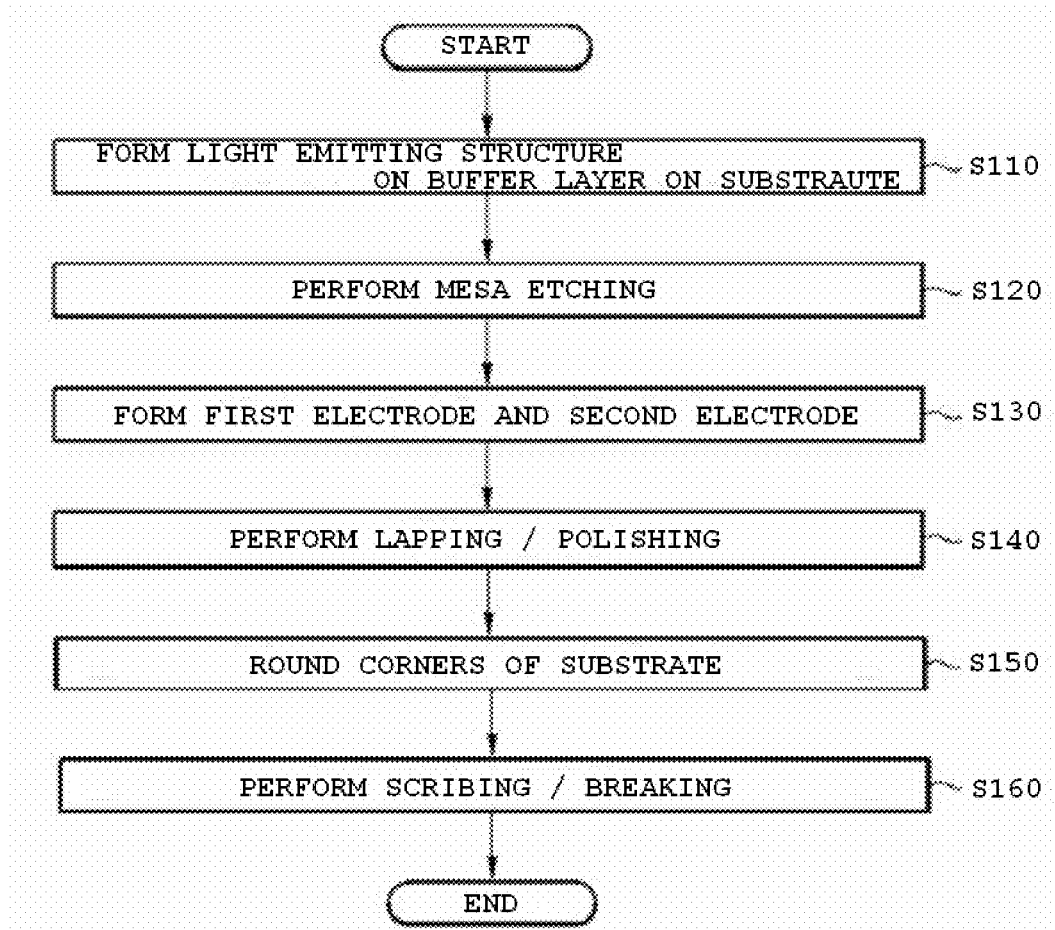
FIG. 7 is a flow chart illustrating a method for manufacturing the nitride semiconductor light emitting device in accordance with the present invention.

FIG. 6 is a longitudinal-sectional view illustrating the nitride semiconductor light emitting device in accordance with the present invention, and FIG. 7 is a flow chart illustrating a method for manufacturing the nitride semiconductor light emitting device in accordance with the present invention.

Now, the method for manufacturing the nitride semiconductor light emitting device in accordance with the present invention will be described with reference to FIGS. 6 and 7. As shown in FIGS. 6 and 7, a buffer layer 112 is formed on a substrate 110, and a light emitting structure 115 including a first conductive semiconductor layer 120, an active layer 130 and a second conductive semiconductor layer 140 is formed on the buffer layer 112 (operation S110).

The substrate 110 is made of a light-transmitting material. Although one embodiment of the present invention uses a sapphire ($Al_2O_3$) substrate as the substrate 110, the substrate 110 may be made of a material selected from the group consisting of GaN, SiC, ZnO, Si, GaP, InP, and GaAs, or may be omitted, as needed.

The buffer layer 112 serves to reduce a difference of lattice constants between the substrate 110 and the light emitting structure 115, and is made of any one selected from GaN, AlN, AlGaN, InGaN, and AlInGaN at a designated thickness (for example 150~1,000 Å). An undoped semiconductor layer (not shown) may be formed on the buffer layer 112, and the undoped semiconductor layer may be made of undoped GaN. At least one layer of the buffer layer 112 and the undoped semiconductor layer may be present on the substrate 110, or both of the buffer layer 112 and the undoped semiconductor layer on the substrate 110 may be omitted.

The light emitting structure 115 may be changed into a p-n junction, an n-p junction, a p-n-p junction, or an n-p-n junction within the technical range of the embodiment of the present invention. Further, another material layer may be added to the upper or lower surface of each of the respective layers 120, 130, and 140 of the light emitting structure 115, but the light emitting structure 115 is not limited to a stack structure of these layers.

The first conductive semiconductor layer 120 may be made of a material having a compositional formula of $In_xAl_yGa_{1-x-y}N$ ($0 \leq x \leq 1$, $0 \leq y \leq 1$, $0 \leq x+y \leq 1$). For example, the first conductive semiconductor layer 120 may be an n-type semiconductor layer made of a material, obtained by bonding a group III element and a group V element, selected from the group consisting of InAlGaN, GaN, AlGaN, and InGaN, and the n-type semiconductor layer is doped with an n-type dopant (for example, Si, Ge, or Sn).

The active layer 130 is formed to a single quantum well structure or a multiple quantum well structure. A conductive clad layer (not shown) may be formed on the upper surface and/or the lower surface of the active layer 130. The conductive clad layer may be an AlGaN layer.

The second conductive semiconductor layer 140 may be, for example, a p-type semiconductor layer. The p-type semiconductor layer may be selected from the group consisting of InAlGaN, GaN, AlGaN, and InGaN, and the p-type semiconductor layer is doped with a p-type dopant (for example, Mg).

A third conductive semiconductor layer (not shown) may be formed on the second conductive semiconductor layer 140.

Mesa etching of a selective region of the second conductive semiconductor layer 140 is performed until the first conductive semiconductor layer 120 is exposed (operation S120).

A first electrode 161 is formed on the exposed first conductive semiconductor layer 120, and a second electrode 163 is formed on the second conductive semiconductor layer 140 (operation S130).

The lower portion of the substrate 110, which provided with the first electrode 161 and the second electrode 163, is polished so as to have a designated thickness by lapping and polishing (operation S140).

The lower portion of the substrate 110 is ground through lapping, and the lapped surface of the substrate 110 is smoothed through polishing. Here, the lapping is carried out by Chemical Mechanical Polishing (CMP), ICP/RIE dry etching, mechanical polishing using sapphire particles, or wet etching using as an etching solution a mixing solution including any one or a combination of at least two out of hydrochloric acid (HCl), nitric acid ($HNO_3$), potassium hydroxide (KOH), sodium hydroxide (NaOH), sulfuric acid ($H_2SO_4$), phosphoric acid ($H_3PO_4$), and a compound ($4H_3PO_4+4CH_3COOH+HNO_3+H_3O$).

Here, the thickness of the substrate 110 may be as thin as possible. However, if the thickness of the substrate 110 is excessively thin, the substrate 110 may warp and be difficult to treat, and thus the thickness of the substrate 110 is preferably about 20~400 μl (more preferably 50~150 μm).

Thereafter, corners of the substrate 110 on which the lapping and the polishing have been completed are rounded (operation S150).

The substrate 110, the corners of which have been rounded, is cut into devices having a designated chip size through scribing and breaking processes (operation S160).

The scribing process may be a laser scribing process or a tip scribing process, and is performed from the substrate 110 or from the second conductive semiconductor layer 140. These post-treatment processes may be changed within the technical scope of the present invention, but are not limited to the above-described scribing and breaking processes.

A process of measuring the individual devices during the scribing process and the breaking process may be performed.

Figure 8:
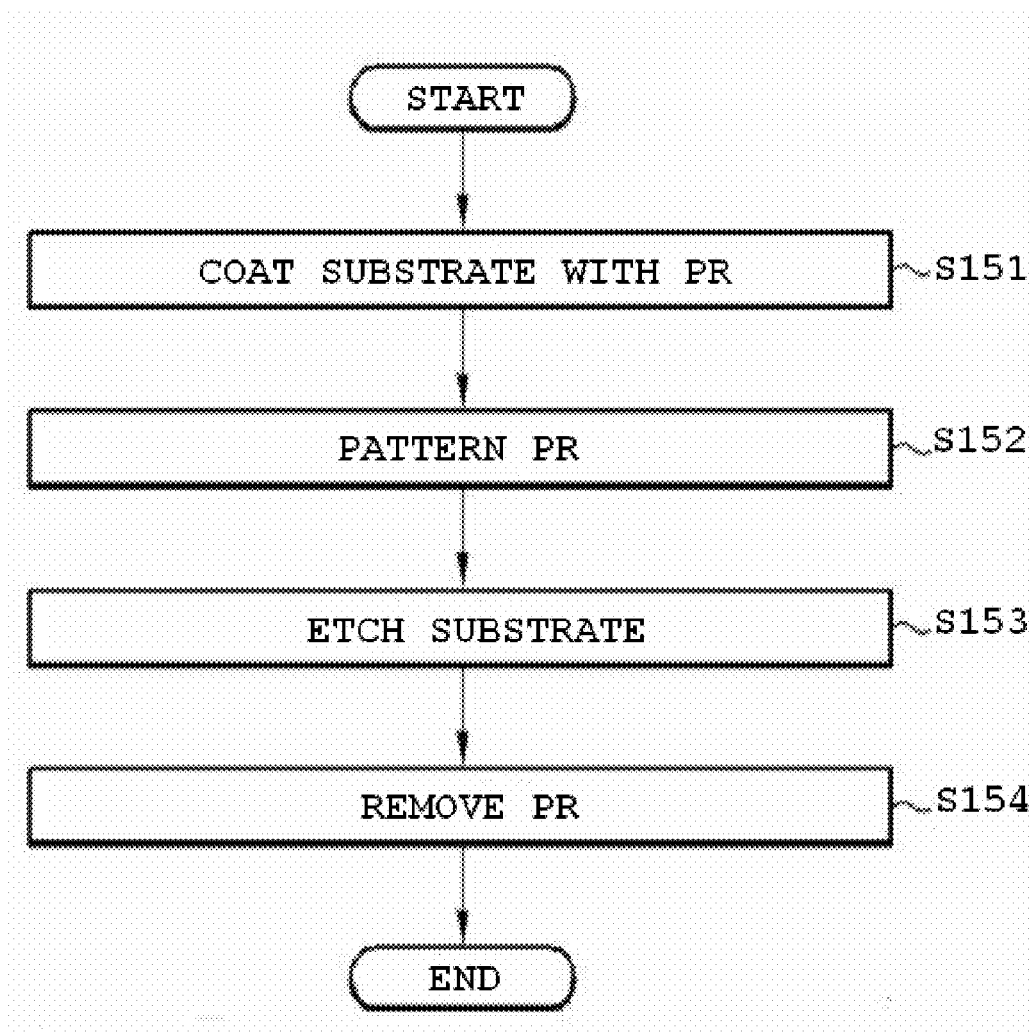
FIG. 8 is a flow chart illustrating a method for rounding corners of the substrate in the method for manufacturing the nitride semiconductor light emitting device in accordance with the present invention.
Figure 9A:
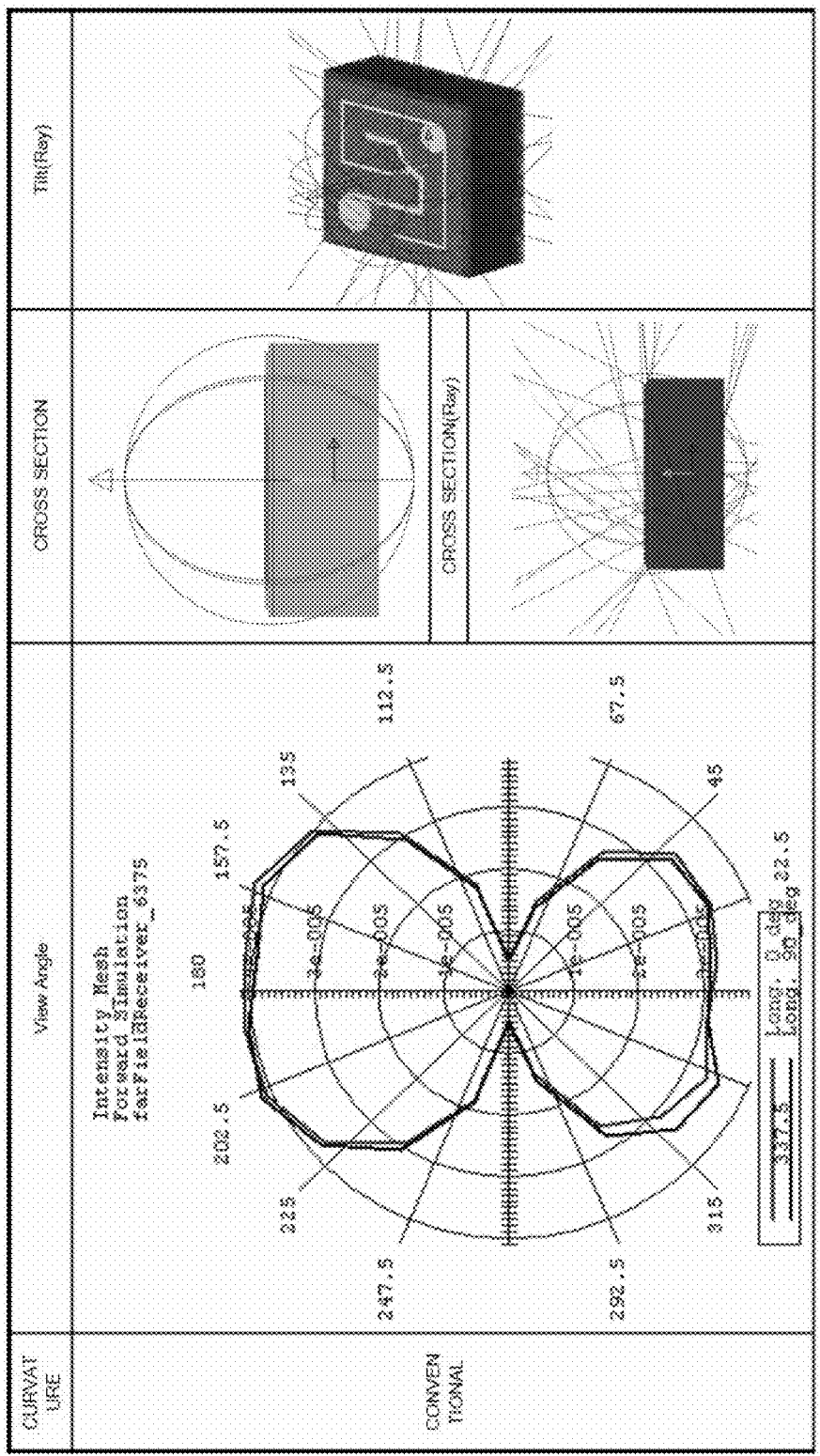
Figure 9D:
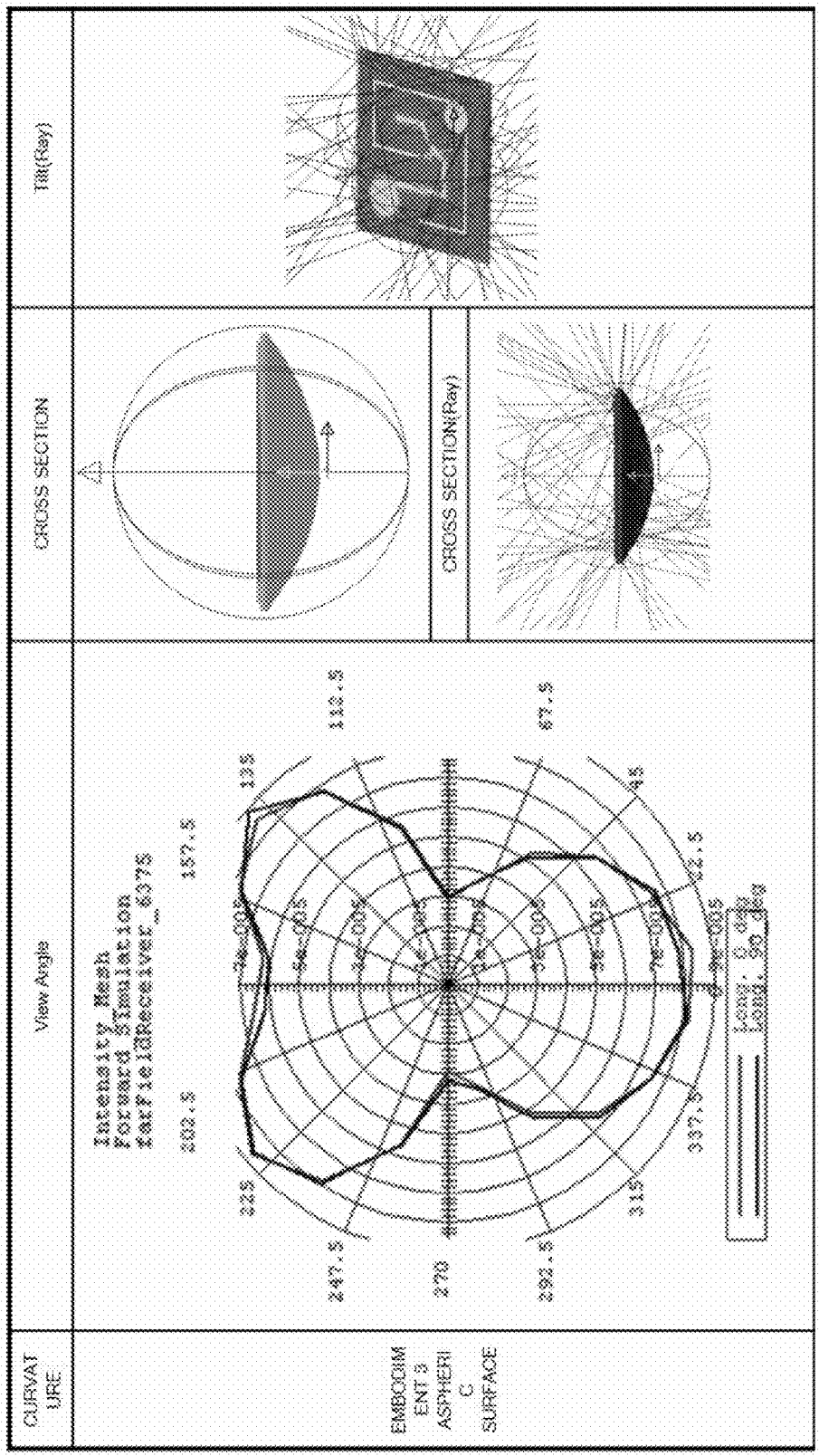
Figure 9E:
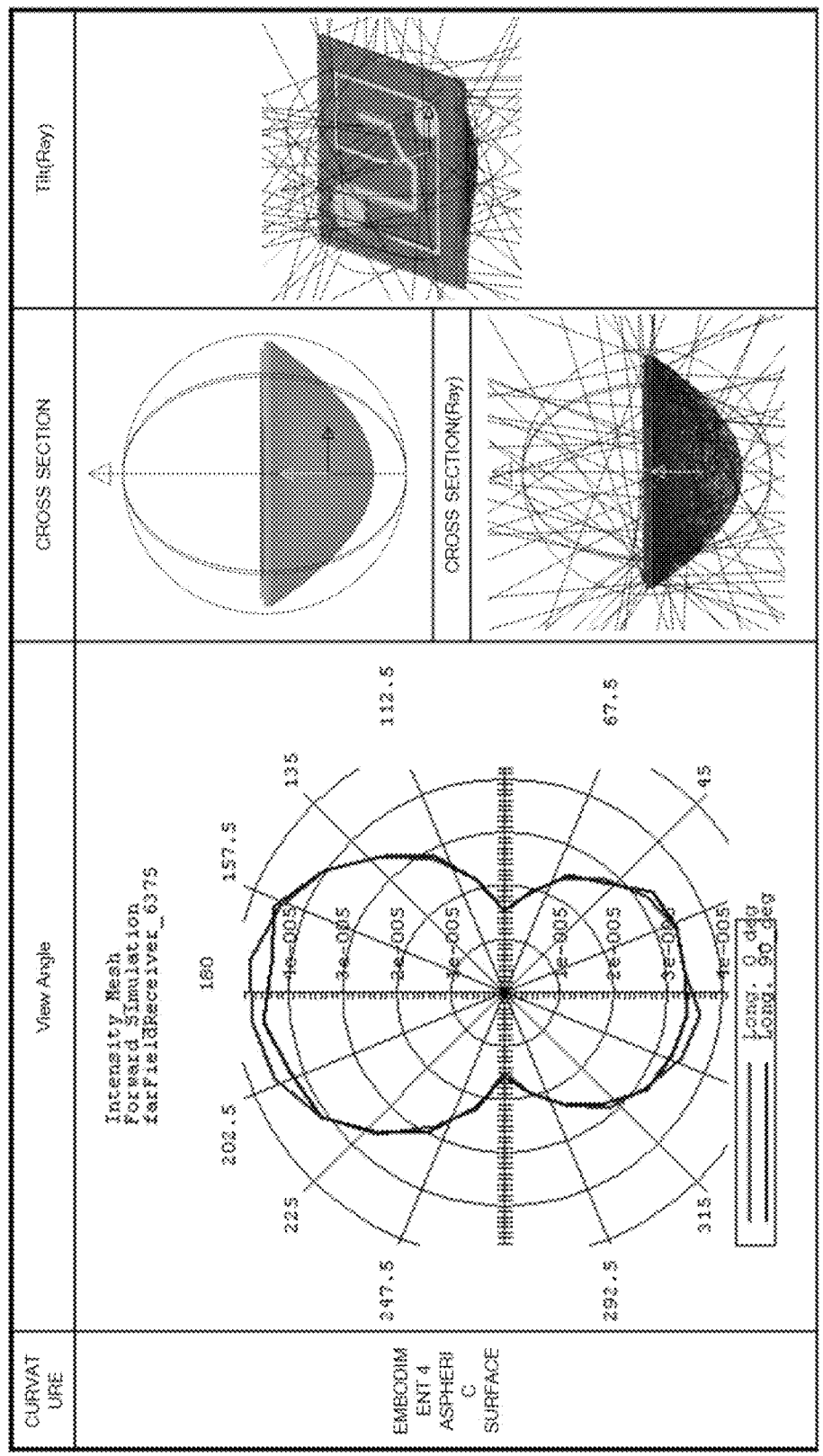

FIG. 8 is a flow chart illustrating a method for rounding corners of the substrate in the method for manufacturing the nitride semiconductor light emitting device in accordance with the present invention.

As shown in FIG. 8, in order to protect the first electrode 161 and the second electrode 163, the surface of the substrate 110 is coated with a photoresist PR to a thickness of 3 μm or more (operation 151).

Thereafter, hard baking of the substrate 110 coated with the photoresist PR is performed within an oven in a chamber atmosphere of a temperature of 120° C.

Thereafter, the photoresist RP is selectively patterned through exposure and development processes using a photo mask (operation S152).

Thereafter, photoresist baking using a hot plate is carried out so as to allow the patterned photoresist PR to have a designated slop. Here, although a proper angle of the slope of the photoresist PR is 45°, the range of the angle of the slope of the photoresist PR is not limited. The slope of the photoresist PR is determined by temperature and baking time of the hot plate.

Thereafter, after photoresist patterning is carried out using the patterned photoresist PR as a mask so as to correspond to the size of the respective nitride semiconductor light emitting devices, the substrate 110 is etched using a dry etching apparatus (operation 153). Here, Inductively Coupled Plasma (ICP) equipment is proper as the dry etching apparatus, and the substrate 110 is etched with a mixture $Cl_2$ and $BCl_3$ gas.

After the etching of the substrate 110 has been completed, the photoresist PR is removed using an organic cleaning agent (operation S154). Here, the photoresist applied to protect surface of the device is removed simultaneously.

Table 1 below compares light extraction efficiency according to shapes of the substrates in the conventional nitride semiconductor light emitting device and the nitride semiconductor light emitting devices in accordance with the embodiments of the present invention. Further, FIGS. 9A-9E show illustrating light extraction efficiency according to shapes of the substrates in the conventional nitride semiconductor light emitting device and the nitride semiconductor light emitting devices in accordance the embodiments of the present invention.

Figure 10:
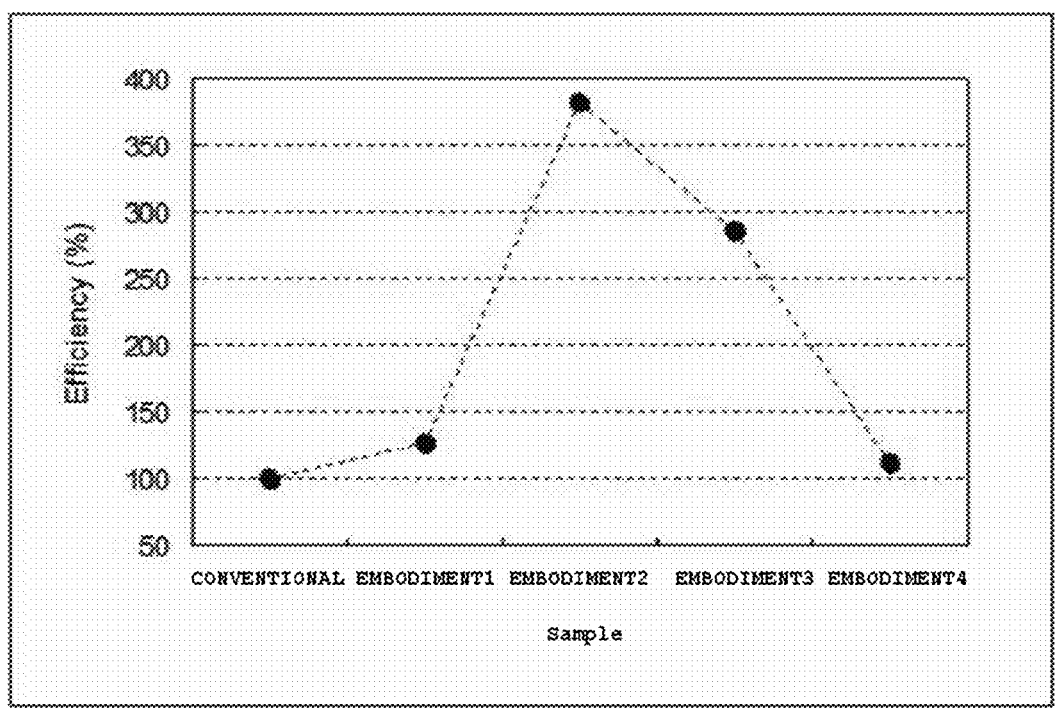
FIG. 10 is a graph illustrating light extraction efficiency according to etching shapes of FIGS. 9A-9E.

FIG. 10 is a graph illustrating light extraction efficiency according to etching shapes of FIGS. 9A-9E.

TABLE 1

| Shape | Conventional | Embodiment (FIGS. 3A and 3B) | Embodiment (FIGS. 4A and 4B) | Embodiment (FIGS. 5A and 5B) |
|---|---|---|---|---|
| Efficiency | 100% | 127% | 386% | 236% |

As shown in Table 1 and FIGS. 9A-9E and 10, if the substrate of the nitride semiconductor light emitting device in accordance with the present invention is processed to have a radian (round) shape, the nitride semiconductor light emitting device in accordance with the present invention maximizes an amount of light generated from the inside thereof and extracted to the outside, compared with the conventional nitride semiconductor light emitting device, thereby improving light extraction efficiency.

The area of the substrate having the rounded corners is equal to the area of the nitride semiconductor light emitting device.

As described above, a nitride semiconductor light emitting device and a method for manufacturing the same in accordance with the present invention have effects, as below.

First, a sapphire substrate used as a substrate of the nitride semiconductor light emitting device is processed to have a lens-shaped cross-section, and thus increases a critical angle of light emitting outwards, thereby improving light extraction efficiency through maximal light extraction.

Second, if a flipchip package is applied, a fluorescent substance is uniformly applied due to a uniform curvature of the substrate.

It will be apparent to those skilled in the art that various modified embodiments and variations can be made in the present invention without departing from the spirit or scope of the inventions. Thus, it is intended that the present invention covers the modified embodiments and variations of this invention provided they come within the scope of the appended claims and their equivalents.

What is claimed is:

1. A nitride semiconductor light emitting device comprising:
a buffer layer formed on a surface of a substrate;
a light emitting structure including a first conductive semiconductor layer, an active layer and a second conductive semiconductor layer, formed on the buffer layer;

a first electrode formed on the first conductive semiconductor layer; and a second electrode formed on the second conductive semiconductor layer, wherein the substrate has a light transmitting property, wherein respective corners of an opposite surface of the substrate are rounded so as to have a designated curvature, such that the substrate has a convex lens-shaped cross-section, and wherein the second conductive semiconductor layer has flat surface.

2. The nitride semiconductor light emitting device according to claim 1, wherein the substrate is made of sapphire.

3. The nitride semiconductor light emitting device according to claim 1, wherein the second conductive semiconductor layer has a mesa structure so as to expose the surface of the first conductive semiconductor layer.

* * * * *